United States Patent [19]
Young et al.

[11] Patent No.: US 6,171,240 B1
[45] Date of Patent: Jan. 9, 2001

[54] MRI RF CATHETER COIL

[75] Inventors: Ian Robert Young, Nr. Marlborough (GB); Michael Burl, Chagrin Falls, OH (US); Jukka I Tanttu, Espoo (FI)

[73] Assignee: Picker International, Inc., Highland Heights, OH (US)

[*] Notice: Under 35 U.S.C. 154(b), the term of this patent shall be extended for 0 days.

[21] Appl. No.: 08/985,842

[22] Filed: Dec. 5, 1997

[30] Foreign Application Priority Data

Dec. 5, 1996 (GB) .................................................. 9625304
Apr. 10, 1997 (GB) .................................................. 9707268

[51] Int. Cl.$^7$ .................................................. A61B 5/055
[52] U.S. Cl. ...................... 600/410; 600/423; 324/322; 324/318
[58] Field of Search .................... 324/307, 309, 324/318; 600/415, 423, 417, 410, 422

[56] References Cited

U.S. PATENT DOCUMENTS

| 4,572,198 | * | 2/1986 | Codrington | 600/410 |
|---|---|---|---|---|
| 4,932,411 | | 6/1990 | Fritschy et al. | 324/318 |
| 5,318,025 | | 6/1994 | Dumoulin et al. | 128/899 |
| 5,347,221 | | 9/1994 | Rubinson | 324/318 |
| 5,699,801 | * | 12/1997 | Atalar et al. | 128/653.2 |
| 5,792,055 | * | 8/1998 | McKinnon | 600/410 |
| 5,928,145 | * | 7/1999 | Ocali et al. | 600/410 |
| 5,964,705 | * | 10/1999 | Truwit et al. | 600/423 |

FOREIGN PATENT DOCUMENTS 0673621    3/1994 (EP).
WO 96/38083 12/1996 (WO).

OTHER PUBLICATIONS

M. Burl, I.R. Young, "A Novel Coil for Catheters or Guide Wires", ISMRM, New York, New York; Apr. 1996; vol. 1.
Daniel A. Leung, et al.; "Intravascular MR Tracking Catheter: Preliminary Experimental Evaluation"; AJR 1995; vol. 164; pp. 1265–1270.
G. C. McKinnon et al.; "Towards Visible Guidewire Antenna for Interventional MRI"; Proceedings Society of Magnetic Resonance, 2$^{nd}$ Meeting, 1994; p. 429.

* cited by examiner

Primary Examiner—Jay Patidar
Assistant Examiner—Tiffany A. Fetzner
(74) Attorney, Agent, or Firm—Fay, Sharpe, Fagan, Minnich & McKee, LLP

(57) ABSTRACT

A radio frequency coil (12, 19) adapted for use in interventional magnetic resonance imaging consists of a loop of an elongated electric conductor arranged to form a twisted wire pair (12, 19) and means associated with it for operating the coil both in transmit and receive mode, in order that the coil does not image anything but tracks its own path on an MR image, without affecting the magnetization in the main bulk of the body being imaged.

22 Claims, 4 Drawing Sheets

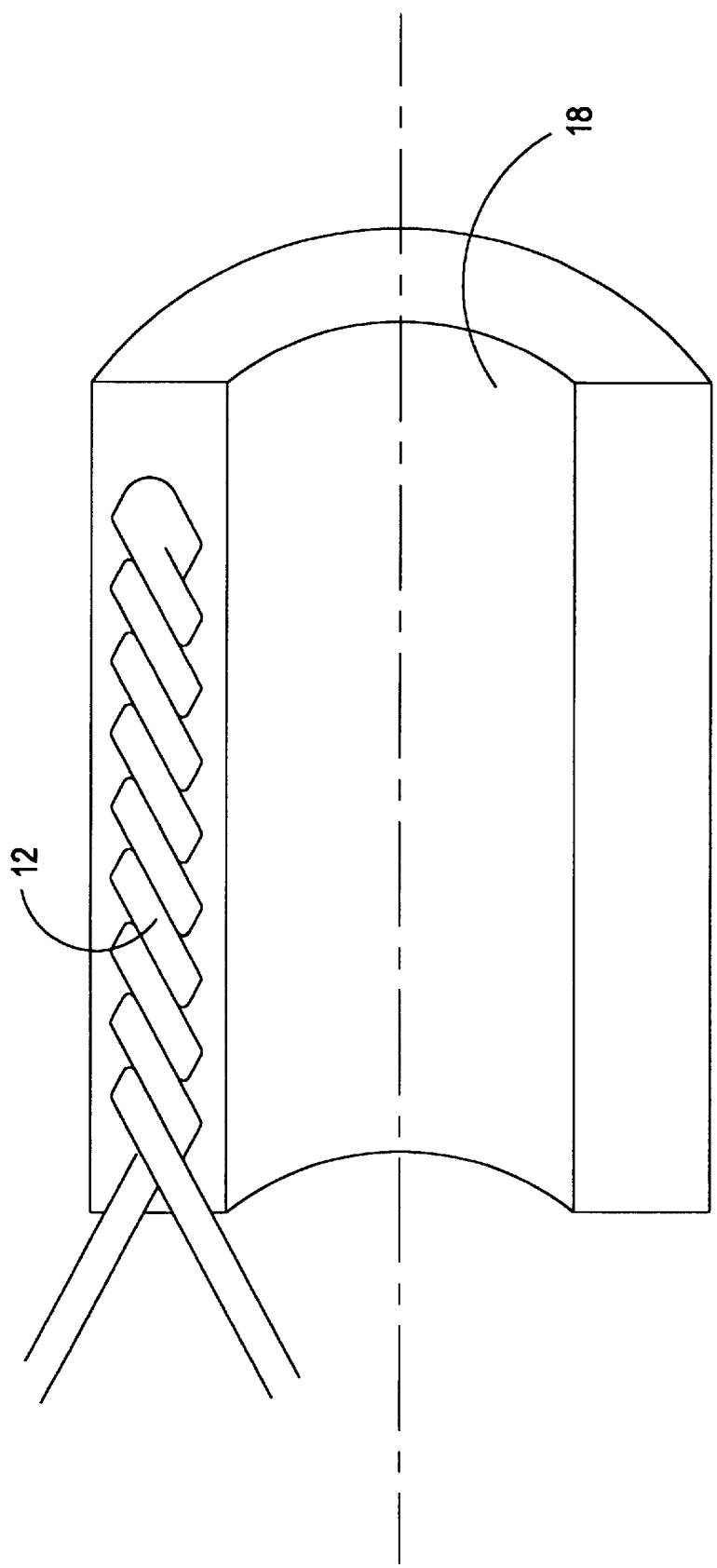

MRI RF CATHETER COIL

This invention relates to radio frequency receiver coils and especially to radio frequency receiver coils for use in interventional nuclear magnetic resonance imaging.

Magnetic resonance imaging (MRI) is used in medicine to produce images of the internal organs of a patient being examined. In MRI, a static magnetic field is applied to the body of the patient to define an equilibrium axis of magnetic alignment in the region of the body being examined. A radio frequency field is then applied to the region being examined in a direction orthogonal to the static magnetic field direction to excite magnetic resonance in the region. This resonance produces signals in r.f coils placed adjacent the body. Normally separate coils are used for excitation and detection although the same coil or coils may be used for both purposes. The detected signals are processed to produce signals representing an image of the patient's body and this image is visually displayed.

In so-called interventional MRI, apparatus may be physically introduced into the body, for example, a catheter through which drugs or other fluids may flow can be inserted into the body. A guide wire can first be inserted until the tip of the wire is at the region of interest in the body. The catheter may be arranged to be co-axial with the guide wire and to surround it so that the catheter can subsequently be introduced into the body along the wire. The guide wire is then withdrawn from the body. Alternatively, the guide wire may be fed inside a partially inserted catheter, to enable it to be guided to a desired region, whereupon the catheter can be withdrawn and an instrument such as a stent for blocking arteries can be slid along the guide wire.

It is desirable that the guide wire and possibly the catheter or any other type of probe used in the body is imaged by the magnetic resonance apparatus so that its position within the body may be determined. Various proposals have been made to achieve this effect.

It is known to employ so-called passive visualisation of catheters and guide-wires but it is difficult to obtain an accurate image of them because of their small size and the fact that their presence itself results in the image being degraded.

Because of these disadvantages so-called active imaging has been proposed. An example of such a proposal is by Dumoulin et al [U.S. Pat. No. 5,318,025 and Magnetic Resonance in Med. 29, 411 (1993)] in which the tip of a catheter is fitted with a small MR coil and an additional small MR measurement sequence is used to determine its position. However, with this proposal there is still the problem of the physical insertion of the catheter within the patient because of the size of the small MR coil referred to earlier.

Subsequently McKinnon et al [Proc $2^{nd}$ Ann. Mtg, SMR, San Francisco, 1994 p.429] proposed the use of a twisted pair stub antenna for the coupling of the electrical field associated with MRI Nuclear Magnetic Resonance. However, problems can arise as a result of coupling to the electrical field.

In another proposal an insulated, current-carrying loop is used. However, the loop works by generating a magnetic field. This is sufficient to spoil the magnetic resonance image and so two images have to be taken; one image while current is flowing through the loop and one image while the current is switched off. A further disadvantage which may be encountered with this proposal is that while the loop is carrying the current it tends to heat up. This is an undesirable effect when the loop is used within the human body. The invention provides a radio frequency coil adapted for use in interventional magnetic resonance imaging, the coil comprising a loop of an elongated electric conductor having outward and return sections arranged to form a twisted pair, and means associated with it for operating the coil both in transmit and in receive mode.

This contrasts with the prior art arrangement referred to earlier in which a stub antenna acts as an electrical field detector, since a loop operates in use as a magnetic field detector, while retaining the advantage that the twisted pair can be made small enough in diameter to pass through needles in common clinical use. The twisted pair does not act as an imaging device with a large field of operation since signals from tissue spaced from the coil integrate to zero. Since the coil has means associated with it for operating in transmit mode, tissue immediately adjacent to it can be excited independently of the rest of the body in which it is located, and so the twisted pair can be tracked without affecting the bulk of the tissue magnetisation. Additionally, the coil of the invention does not couple with the main transmitter coil used for imaging the body. The presence of such coupling would tend to spoil the magnetic resonance image.

The invention also provides a method of visually locating a guide wire, for guiding a catheter for use in interventional MRI, which comprises providing as the guide wire a coil comprising a closed loop of an elongated conductor having outward and return sections arranged to form a twisted pair, and operating the coil both in transmit and receive mode.

The present invention is concerned with providing a radio frequency receiver coil which will give a strong signal as to its position but which will not have the disadvantages referred to earlier in connection with the prior art. In this connection with radio frequency receiver coils for use in NMR systems the image resolution is around 1 mm. Therefore in order to provide an actual image it is necessary to see a number of millimetres. Thus prior art imaging devices of this kind by necessity have to be a certain minimum size. According to the present invention a radio frequency receiver coil for use in an NMR system is below the aforementioned minimum size and is incapable of providing an image except one indicative of its own position.

How the invention may be carried out will now be described, by way of example, with reference to the accompanying drawings in which:

FIG. 4 is a schematic diagram showing a partially cut away longitudinal view of a catheter incorporating a coil built into its wall according to the invention.

Figure 1:
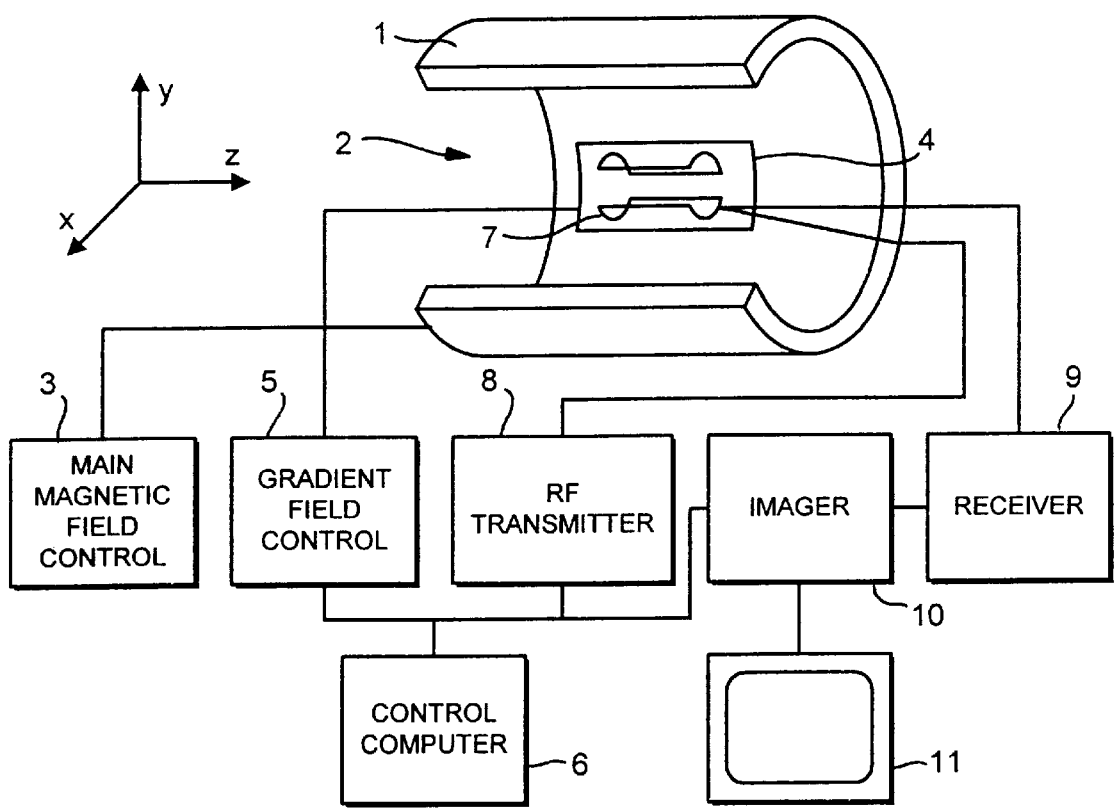
FIG. 1 is a schematic diagram of a typical magnetic resonance imaging apparatus.

Referring to FIG. 1, the magnetic resonance imaging apparatus comprises a tubular electromagnet 1 which produces a uniform, static axial magnetic field in a cylindrical volume 2 into which a patient being examined is placed in use of the apparatus.

The strength of the magnetic field which acts along the z-axis of FIG. 1 is controlled by a main magnetic field control 3 which controls the supply of current to the electromagnet energising coil (not shown). Other means of controlling the strength of the magnetic field may be employed.

The apparatus also comprises a coil arrangement 4 whereby a gradient magnetic field may be superimposed on the static magnetic field in any one or more of three orthogonal directions. The coil arrangement 4 is energised by a gradient field controller 5 which is controlled by a computer 6.

An r.f. coil system 7 is also included, energised by an r.f. transmitter 8 under control of computer 6, which applies an r.f. field pulse to the body being imaged in a direction orthogonal to the main static magnetic field direction. This has the effect of tipping the spins of nuclei in the patient's body from the direction of the static magnetic field (the z-direction) into a plane orthogonal to the static field direction i.e. into the x-y plane of FIG. 1. R.f. signals resulting from magnetic resonance excited in the patient's body are spatially encoded by application of one or more gradient magnetic fields, and these r.f. signals are detected by coil system 7. The detected signals are passed via a receiver 9 to an imager 10 which, under control of computer 6, processes the signals to produce signals representing an image of the body. These signals are passed to a display 11 to provide a visual display of the image.

Figure 2:
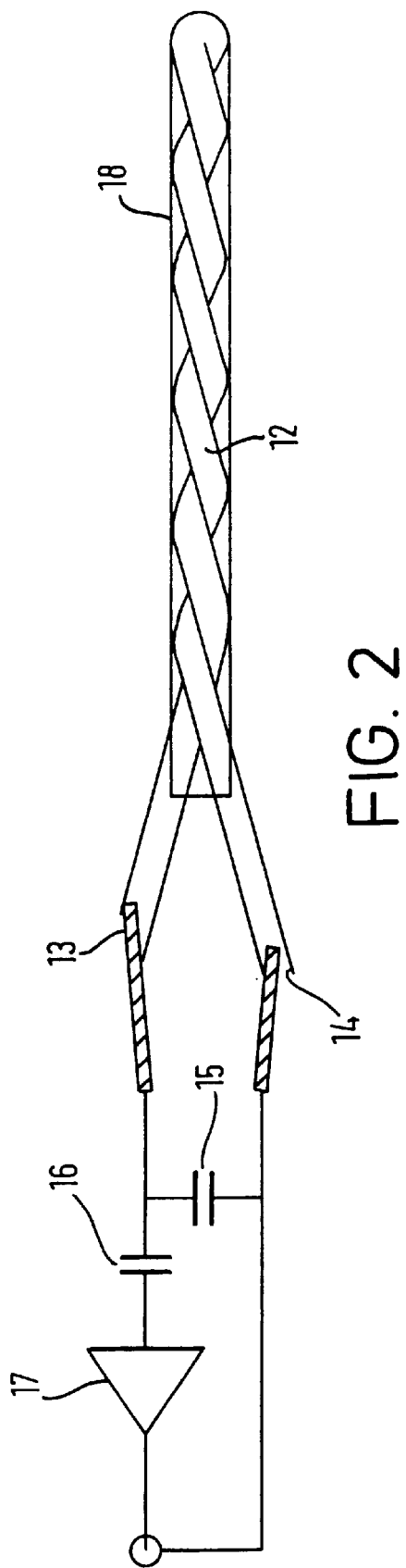
FIG. 2 is a schematic circuit diagram of a catheter incorporating a first coil constructed according to the invention.

In interventional magnetic resonance imaging, a catheter or other similar device is inserted into the body so that, for example a drug may be administered or minimally invasive surgery may be carried out. To enable an image of the catheter, or of the guide wire which assists positioning of the catheter, to be seen, regardless of the catheter's orientation, a coil according to the present invention and as shown in FIG. 2 may be employed.

The coil 12 comprises an elongated loop of insulated wire twisted about its longitudinal axis a plurality of turns so as to form a rope-like coil. The ends 13, 14 of the coil are connected across a capacitor 15, the capacitance of which can be varied so that the circuit can be tuned to the Larmor frequency of the nuclei of interest for the main field in question. For example, the Larmor frequency of Hydrogen atoms is 42.6 MHz/T. A further capacitor 16 is provided so that the impedance of the coil 12 and capacitor 15 may be matched with that of the input of a low noise preamplifier 17. Signals from amplifier 17 are input to a channel of receiver 9. The coil is operable in a transmit/receive mode or, optionally, in a receive mode only, in which case the coil is not used to generate a magnetic field.

The operation is as follows. An r.f. pulse is applied to the body coil 4 and a sequence of magnetic gradients are applied in the presence of a main magnetic field in the usual manner in order to produce an MR image of the patient. A catheter 18 housing the twisted wire pair 12 is then inserted in a desired passage in the patient. A pulse is transmitted from the twisted pair, and the resulting relaxation signals are detected by the twisted pair, typically in the presence of the same sequence of magnetic gradients as was used to produce the MR image of the patient. This image, which just indicates the path of the twisted pair, is then superimposed on the main MR image of the patient. The catheter is then manipulated forwards, and further images of the twisted pair are made in the same manner and superimposed on the MR image of the patient. This is continued until the catheter is manipulated to a desired position. If the patient moves, a further MR image is produced and the twisted pair image is superimposed on this fresh image.

Because the excitation signal applied to the twisted pair does not affect substantially the bulk magnetisation of the patient, there is no need to wait, if an image of the patient is required, to allow that magnetisation to restore to its undisturbed values. Also, the standard MR imaging sequence can be used to detect the path of the twisted pair: a separate MR sequence (which again could affect the bulk magnetisation of the patient) for the twisted pair excitation is not needed.

Thus, the coil shows up as an image produced by the MRI apparatus. However, because the coil is twisted, the net integral magnetic field along the length of the coil is substantially zero, and so the coil of the invention does not interfere with the magnetic resonance signals detected by the coil system 7 of FIG. 1. Hence, the MRI image is not spoiled, which was a problem with the current-carrying loops of the prior art.

The signal from the coil only images the path of the coil. Anything at normal imaging distance from the coil induces opposing currents in adjacent turns of the coil. Only matter such as blood in the immediate vicinity of the twisted pair will produce a net signal from the coil.

Coil 12 is shown incorporated in catheter 18, which comprises a tube for insertion into a part of the body. If the catheter is used to administer fluids inside the body, the coil may be withdrawn when the catheter has reached the region of interest. Alternatively, as best seen in FIG. 4, the coil can be built into the wall of a catheter to enable the catheter to be seen on a magnetic resonance image while surgery is being carried out. Equally, the catheter may be withdrawn to enable an instrument to be slid along the guide wire.

The overall width of the coil, including insulation, is typically less than one mm. In tests, the coil has been tuned to 21 MHz but may be used at other frequencies, as required. Coupling between the coil and any external detection (or receiver) coils is negligible and does not affect the signals from the transmitter coils or the detection coils. There will be places where the net local flux generated by the coil lies along $B_0$ i.e. the direction of the main magnetic field. These regions will be much less apparent in the images, however, as some part or other of any likely-sized voxel will produce some detectable signal.

In one example, the coil was made of an insulated conductor with core diameter 0.20 mm, and overall wire diameter 0.24 mm. When twisted with a pitch of around 6.5 mm, the coil had an overall diameter of 0.48 mm. Its length was 350 mm. The coil was tuned, and matched to the 50Ω input to the machine. The tuning capacitor was 220 pF, and the matching (series) capacitor 150 pF. Coil Q in saline was approximately 15. The field of view of such a coil was extremely small. The test coil had an inductance of 750 nH, and was tuned to 21.35 MHz. The coil was wound into a ring and placed in a so-called phantom solution of saline and copper sulphate. The saline solution simulates the internal human body. Copper sulphate is added to reduce the relaxation time constant of the saline solution, thus enabling tests to be repeated frequently. The addition of copper sulphate also permits the magnetisation time constant of the phantom solution to be matched to that of human tissue. An image of the coil was formed with an MRI scanner and also with an enveloping coil. The test coil produced a rope-like pattern of high intensity signal that was visible at all orientations of the test coil and all along its length. When the phantom solution was imaged by the enveloping coil there were small dark regions on the visual display which were attributed to the displacement of the phantom solution. No bright regions appeared on the image, the presence of which would suggest magnetic coupling between the test coil and the external coil. The magnetic field sensitivity in the region close to the test coil was calculated to be 6.25 $\mu T/A$.

At higher frequencies, an untuned coil may be used. In this case, the coil is preferably terminated to minimise standing wave reflections.

Figure 3:
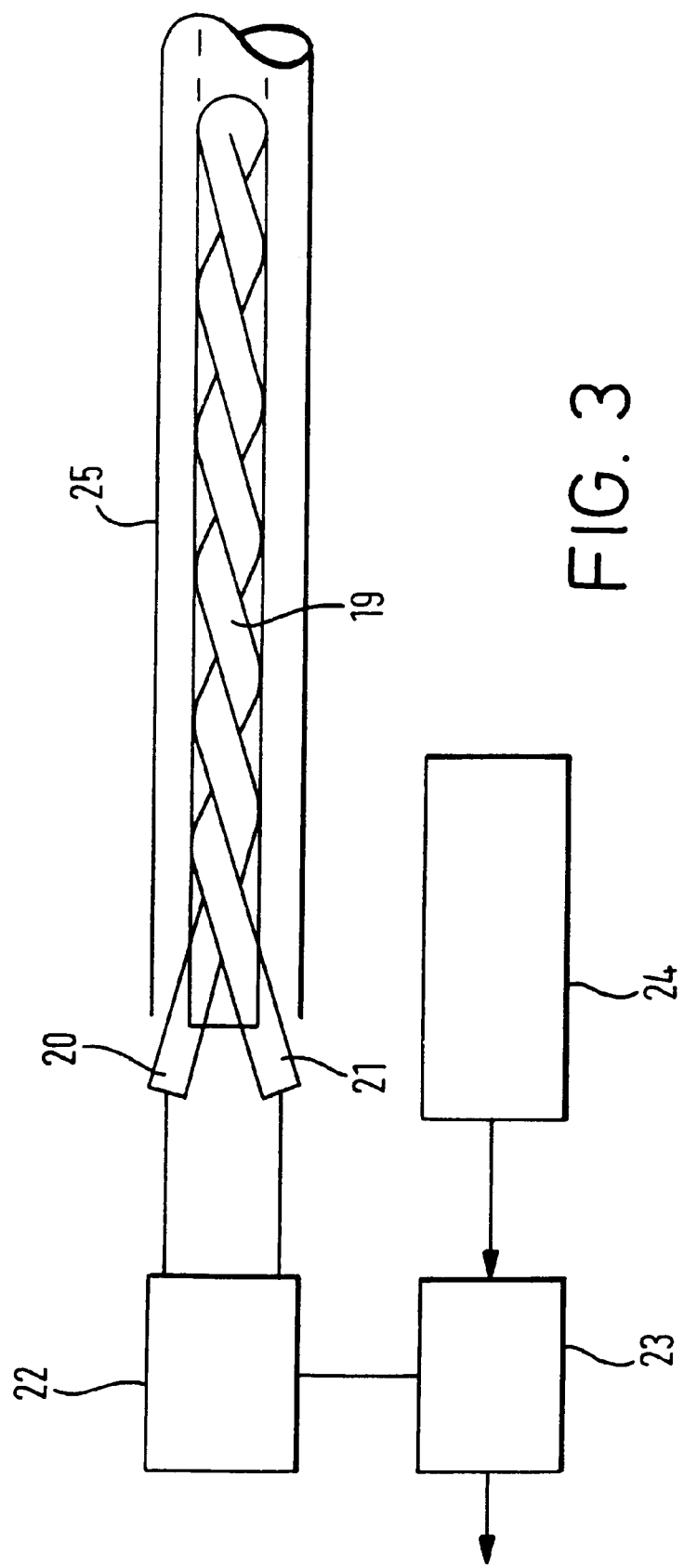
FIG. 3 is a schematic circuit diagram of a catheter incorporating a second coil according to the invention.

Referring to FIG. 3, the coil 19 only operates in transmit/receive mode but the operation is otherwise the same as for the coil of FIG. 2. The embodiment is designed and intended to be mounted within or be otherwise carried by an interventional device for use with MR imaging equipment. Typically such an interventional device could be a catheter or a guide wire. The loop or coil of wire 19 is twisted on itself to form a twisted pair having two leads 20 and 21. The wire in this example is 0.25 mm diameter with insulation having a thickness of 0.12 mm. The twisted pair loop 19 is tuned to 21.3 MHz.

The loop or coil 19 is connected to a scanner (typically a 0.5T Picker Asset Scanner) via the scanners matching network 22, a transmit/receive switch unit 23 and an r. f. transmitter power amplifier 24 to give a maximum two watts output. The loop 19 is shown located within a catheter 25. The coil 19 is operated both as a transmitter and as a receiver in order to excite and detect the magnetisation of matter around the coil and provide an indication of the position of the coil and thus of the catheter 25. The coil does not act as an imaging device as its cross-section is too small to do so. It was found as a result of experimentation that the embodiment shown in FIG. 3 of the drawings produced a significantly better image when operated in a transmit/receive mode (as distinct from merely in a receive mode) than the arrangement disclosed by McKinnon referred to in the introduction to the present specification. More specifically the image had virtually no bead-like appearance when the device of FIG. 3 was being operated both as a transmitter and a receiver whereas this was the case when the device of FIG. 2 was only being operated as a receiver or detector. For both embodiments of FIGS. 2 and 3, the coil is resonant at the frequency of the $B_1$ r.f. excitation pulses. Hence during the transmission pulse, the $B_1$ field close to the catheter coil will be dominated by the field created by the coil itself. The $B_1$ field close to the coil may be substantially larger (of the order of 5 to 10 times larger) than without the coil. Thus, in the case of a 10 times increase, by using a very small nominal flip angle (<10°), it would be possible to create a 90° pulse close to the coil.

Variation s may be made without departing from the scope of the invention. Thus, instead of the receiver coils being connected directly to a receiver channel of the magnetic resonance processing electronics, the loops could terminate in a second loop, which second loop could be inductively coupled to a loop connected to the receiver channel, and, if required, be inductively coupled to a loop connected to a transmitter as well.

The invention has been described with reference to the preferred embodiment. Obviously, modifications and alterations will occur to others upon reading an understanding the preceding description. It is intended th at the invention be construed as including all such modifications and alterations insofar as they come within the scope of the appended claims or the equivalents thereof.

What is claimed is:

1. A radio frequency coil adapter for use in interventional magnetic resonance imaging, the coil comprising:
    a loop of an elongated electric conductor having outward and return portions arranged to form a twisted pair; and
    means for operating the coil in both transmit and receive modes,
    wherein, when in the receive mode, said coil has a net sensitivity to nuclear magnetic resonance signals only from tissue substantially adjacent thereto, and, when in the transmit mode, said coil excites only tissue substantially adjacent thereto without substantially affecting bulk tissue magnetization.

2. The coil of claim 1 wherein the outward and return sections are insulated.

3. The coil of claim 1 wherein the overall width of the coil is less than 1.5 mm and a pitch of the twisted pair is approximately 6.5 mm.

4. The coil of claim 1 wherein the coil is inductively coupled to the processing electronics of a magnetic resonance imaging apparatus.

5. The coil of claim 1 wherein the means for operating comprise a transmit/receive switch and an r.f. amplifier.

6. The coil of claim 1 wherein the coil is inserted in a catheter.

7. The coil of claim 1 wherein the coil is adapted for use as a catheter guidewire.

8. The coil of claim 1 wherein the coil is affixed to a surgical instrument.

9. The coil of claim 8 wherein the surgical instrument is a catheter and the coil is built into the wall of the catheter.

10. A method of interventional magnetic resonance imaging, the method comprising the steps of:
    inserting a patient to be imaged in an imaging region of a magnetic resonance imaging apparatus;
    placing a coil within the patient, said coil being substantially decoupled from a transmit coil and said coil comprising a loop of elongated electrical conductor, the conductor having outward and return portions arranged to form a twisted pair; and,
    operating the coil as a transmitter and as a receiver during respective portions of a magnetic resonance excitation and detection sequence so as to obtain an indication of a position of the coil in relation to surrounding anatomy of the patient.

11. The method of claim 10 wherein the coil is operated as a transmitter during a $B_1$ r.f. excitation pulse generated during the sequence.

12. The method of claim 10 further comprising the steps of:
    inserting a catheter within the patient to be imaged; and
    inserting the loop within the catheter.

13. The method of claim 10 further comprising the step of using the coil to guide the application of a medical instrument.

14. The method of claim 13 wherein the medical instrument is a catheter.

15. The method according to claim 13 further comprising the step of removing the coil from the patient.

16. A method of magnetic resonance imaging comprising the steps of:
    (a) applying an r.f. pulse sequence and gradient pulse sequence in the presence of a main magnetic field in order to produce an MR image of a patient;
    (b) inserting a coil within the anatomy of the patient, the coil comprising an electrical conductor wound in a bifilar configuration;
    (c) applying an r.f. transmission pulse sequence to the coil and detecting resulting relaxation signals with the coil in order to produce an image of the coils's path; and,
    (d) superimposing the image of the coil's path on the MR image of the patient so as to obtain an indication of the location of the coil in relation to the anatomy of the patient.

17. The method of claim 16 further comprising the step of using the coil as a guidewire.

18. The method of claim 16 wherein the position of the coil with respect to a surgical instrument is known and further comprising the step of using the position of the coil to provide and indication of the position of the instrument.

19. The method of claim 17 wherein the instrument is a catheter and the coil is affixed to the catheter.

20. The method of claim 17 wherein the instrument is a catheter and the coil is located within the catheter.

21. The method of claim 16 wherein magnetic gradients used in connection with producing the MR image of the patient are substantially identical to magnetic gradients used in connection with producing the image of the coil's path.

22. The method according to claim 16 further comprising the steps of:

(e) carrying out an additional step (b) following step (c) without waiting for a bulk magnetization of the patient to be restored.

* * * * *